United States Patent [19]

Takaoka et al.

[11] Patent Number: 5,001,335

[45] Date of Patent: Mar. 19, 1991

[54] SEMICONDUCTOR PHOTODETECTOR DEVICE AND METHOD OF MANUFACTURING THE SAME

[75] Inventors: Keiji Takaoka, Yokohama; Tetsuo Sadamasa, Chigasaki; Motoyasu Morinaga, Yokohama; Nobuo Suzuki, Tokyo; Kenji Matsumoto, Yokohama, all of Japan

[73] Assignee: Kabushiki Kaisha Toshiba, Kawasaki, Japan

[21] Appl. No.: 460,005

[22] Filed: Dec. 29, 1989

[30] Foreign Application Priority Data

Jan. 31, 1989 [JP] Japan ............................ 1-21070

[51] Int. Cl.$^5$ .............................................. H01J 40/14
[52] U.S. Cl. ................................... 250/211 J; 357/30
[58] Field of Search ............. 250/211 J; 357/13, 30 A

[56] References Cited

U.S. PATENT DOCUMENTS

| 4,586,067 | 4/1986 | Webb | 357/30 |
| 4,586,067 | 4/1986 | Webb | 357/30 |
| 4,877,951 | 10/1989 | Muro | 250/211 J |
| 4,914,494 | 4/1990 | Webb | 357/30 A |

FOREIGN PATENT DOCUMENTS

| 0763546 | 12/1987 | European Pat. Off. . |
| 0163546 | 12/1987 | European Pat. Off. . |

OTHER PUBLICATIONS

Technical Digest of the European Conference on Optical Communications, Helsinki, Sep. 13th–17th, 1987, vol. 1, pp. 55–61; T. Shirai et al.: "A New InP/GaInAs reach-through avalanche photodiode" *Figure 1*.
Patent Abstracts of Japan, vol. 12, No. 69 (E-587)[2916], Mar. 3rd, 1988; & JP-A-62 211 967 (Fujitsu Ltd) 17-09-1987 *Whole document*.

*Primary Examiner*—David C. Nelms
*Attorney, Agent, or Firm*—Oblon, Spivak, McClelland, Maier & Neustadt

[57] ABSTRACT

Disclosed are an avalanche photodiode and a manufacturing method thereof. An $n^-$-type InGaAs light absorption layer and $n^-$-type InP window layer are formed on an n-type InP substrate by crystal growth, in the order mentioned. A depression is formed in a selected surface portion of the window layer, and n-type impurities are doped into the bottom of the depression, to thereby form an n-type high concentration region. Further, $n^-$-type crystal-grown InP layer is formed in the depression in such a way as to fill the depression. A guard ring is formed around the depression by the doping of p-type impurities. By doping p-type impurities into the window layer, a p-type high concentration region is formed in the window layer in a manner completely surrounding the interface between the n-type high concentration region and the crystal-grown InP layer. The n-type and p-type high concentration regions define a junction serving as a light-receiving region. Since the interface of the crystal-grown InP layer, which may not have a satisfactory crystalline structure, is located within the p-type high concentration regions, that interface is not supplied with a high electric field during use. Accordingly, the performance of the avalanche photodiode is not influenced by the interface.

10 Claims, 4 Drawing Sheets

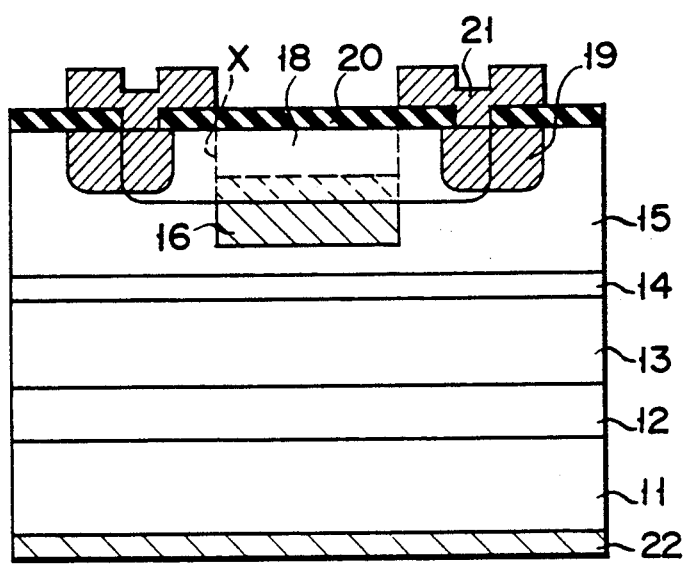
F I G. 2

SEMICONDUCTOR PHOTODETECTOR DEVICE AND METHOD OF MANUFACTURING THE SAME

BACKGROUND OF THE INVENTION

1. Field of the Invention

The present invention relates to semiconductor photodetector devices, and more particularly to semiconductor photodetector devices having an avalanche effect, and a method of manufacturing them.

2. Description of the Disclosure

A so-called avalanche photodiode (hereinafter abbreviated as an APD), wherein carriers are generated by irradiating light onto a pn junction applied with a reverse bias voltage, and are avalanche-multiplied by impact ionization caused by the carriers, is featured by its remarkable internal multiplication effect, high response characteristic, etc. Among various types of APDs, an InP-based APD whose light absorption layer is formed of either InGaAs or InGaAsP and whose carrier-multiplication layer is formed of InP is particularly advantageous, in light of its high quantum efficiency and low noise characteristic. This type of InP-based APD is useful as a semiconductor photodetector device for detecting waves in the 1 μm band, and constant efforts are being made to develop an improved, practical InP-based APD.

FIG. 1 illustrates the conventional APD disclosed in Published Unexamined Japanese Patent Application No. 57-198667. This conventional APD is manufactured by executing a crystal growing step twice. The manufacturing process will be briefly mentioned. First of all, n⁻-type InP buffer layer 52, n⁻-type InGaAs light absorption layer 53, n-type InGaAsP buffer layer 54, and n⁻-type InP layer 55 are formed on n-type InP substrate 51 by crystal growth in the order mentioned (the first crystal growing step). Next, Si ions serving as n-type impurities are implanted into a selected portion of n⁻-type InP layer 55, and the resultant structure is annealed, to thereby form n-type InP region 56. After n⁻-type InP layer 57 is formed on the resultant structure by crystal growth (the second crystal growing step), p-type region 59 serving as a guard ring is formed by the implantation of Be ions and subsequent annealing. Thereafter, p⁺-type region 58 serving as a light-receiving region (which includes a pn junction between n-type and p-type semiconductors and its neighboring portions) is formed by the diffusion of Cd. Finally, SiN film 60 serving as a reflection-preventing film, p-type electrode 61, and n-type electrode 62 are formed.

In general, a guard ring is formed for the purpose of preventing an edge breakdown from occurring in regions which are located around a light-receiving region and in which the radius of curvature of a pn junction is short. For this purpose, the guard ring is made to have a graded junction, whereas the light-receiving region is made to have an abrupt junction. In the structure illustrated in FIG. 1, the guard ring fulfills its function effectively since n-type low concentration layers 57 and 55 are located under the guard ring so as to decrease the maximum electric field and thereby suppress the breakdown in the guard ring region. On the other hand, an n-type high concentration region 56 is located under the light-receiving region so as to increase the maximum electric field in the light-receiving region.

To manufacture the above-mentioned structure, crystals of InP have to be grown after the selective ion-implantation of n-type impurities and the succeeding annealing. Normally, this crystal growth has been performed by using a meltback technique in the liquid phase epitaxial growth process, so as to provide a satisfactory interface and a crystalline region. In recent years, however, there is a tendency to manufacture compound semiconductor devices by use of a vapor phase epitaxial growth process, such as an MOCVD process, which is superior to a liquid phase epitaxial growth process in terms of the controllability of carrier concentration and film thickness. With this tendency, more APDs have come to be manufactured by use of the vapor phase epitaxial growth process, as long as their manufacture requires only one crystal growing step. In the case of the manufacture of super high-speed APDs, the vapor phase epitaxial growth process is indispensable.

However, if a crystal growing step is required twice, as in the manufacture of the above-mentioned structure, and if the second crystal growing step is performed by use of the vapor phase expitaxial growth process, then distortion of the lattice and precipitation of impurities at the interface will be more marked than in the case where the meltback technique is used in the liquid phase epitaxial growth process. And in the case of the above-mentioned structure, the interface formed by the second epitaxial growth step will be located in the n-side region of the p⁺n junction, as may be understood from FIG. 1. Since, therefore, a high electric field is supplied at the interface which is located n-side region during APD operation, a dark current may increase and local breakdown may occur. In addition to these problems, the above-mentioned structure has problems in that its guard ring is inevitably formed in the region formed by the second crystal growing step (which region does not have a good crystalline condition). These problems may also occur where the second crystal growing step is performed by use of the liquid phase growth process.

SUMMARY OF THE INVENTION

Accordingly, an object of the present invention is to provide a semiconductor photodetector device whose crystalline structure in the neighborhood of the interface of two step epitaxial growth layers can be formed in the vapor phase epitaxial process without causing the above problems. Another object of the present invention is to provide a method of manufacturing the semiconductor photodetector device.

The first object of the invention is achieved by providing a semiconductor photodetector device which comprises: a light absorption layer of a first-conductivity type; a window layer which is of the first-conductivity type and formed on the light absorption layer (the window layer is formed of a semiconductor whose forbidden band width is wider than that of the semiconductor of the light absorption layer, and thus allows a light of a predetermined wavelength to pass therethrough); a high concentration region which is of the first-conductivity type and located in the bottom of a depression formed in a selected surface portion of the window layer; a re-grown region which is of the first-conductivity type and formed over the first-conductivity type high concentration region in such a manner as to fill the depression; a guard ring which is of a second-conductivity type and formed around the depression; and a high concentration region which is of the second-conductivity type and formed in the window region in such a way as to completely surround the re-grown region, the first and second-conductivity type high concentration regions jointly providing a pn junction used as a light-receiving region.

The second object of the invention is achieved by providing a method of manufacturing a semiconductor photodetector device, which method comprises the steps of: growing a first-conductivity type light absorption layer and a first-conductivity type window layer on a first-conductivity type substrate crystal; forming a depression in a selected surface portion of the window layer; forming a first-conductivity type high concentration region in the bottom of the depression by doping first-conductivity type impurities into the bottom of the depression; forming a first-conductivity type re-grown region by growing a first-conductivity type crystalline layer on the first-conductivity type high concentration layer in such a way as to fill the depression; forming a guard ring of the second-conductivity type around the depression by doping second-conductivity type impurities into a region located around the depression; and forming a second-conductivity type high concentration region by doping second-conductivity type impurities into the window layer in a manner which completely surrounds the first-conductivity type re-grown region, whereby a pn junction used as a light-receiving region is defined between the first and second-conductivity type high concentration regions.

In the semiconductor photodetector device of the present invention, an interface located by the second crystal growing step is located in the second-conductivity type high concentration region and is not therefore supplied with a high electric field during the usage of the device. Therefore, the performance of the device is not influenced by the re-grown interface (which may not have a satisfactory crystalline structure). Moreover, APDs which produce little dark current and are very reliable can be manufactured with a high yield.

In practice, it is preferable that the first and second-conductivity types be n and p types respectively, the light absorption layer be formed of either InGaAs or InGaAsP, and each of the substrate crystal, the window layer and the re-grown layer be formed of InP.

Normally, the above first-conductivity type high concentration region and the guard ring are formed by use of an impurity ion-implantation process, and the second-conductivity type high concentration region is formed by use of an impurity thermal diffusion process.

Simultaneous with the above-mentioned guard ring, a second guard ring of a second-conductivity type can be formed such that it is located below the above guard ring, with the first-conductivity type low-impurity concentration layer interposed. To simultaneously form the two guard rings, it is preferable that the first-conductivity type impurity concentration in the window layer be higher than that in the light absorption layer, and that the second-conductivity type impurities be doped into the layers such that the impurity concentration gradually decreases from the surface of the window layer toward the internal regions. Let it be assumed that $C_{DX}$ denotes the first-conductivity type impurity concentration in regions located between the substrate crystal and the surface of the window layer, and $C_{AG}$ denotes the doping concentration of the second-conductivity type impurities. In this case, the relation $C_{AG} > C_{DX}$ is established in the surface regions of the window layer, the relation $C_{AG} < C_{DX}$ is established in regions just above the light absorption layer, the relation $C_{AG} > C_{DX}$ is established in the upper-most portion of the light absorption layer and the relation $C_{AG} < C_{DX}$ is established in regions just above the substrate crystal.

BRIEF DESCRIPTION OF THE DRAWINGS

FIG. 2 is a sectional view showing the structure of an APD according to the first embodiment of the present invention;

DETAILED DESCRIPTION OF THE PREFERRED EMBODIMENTS

Figure 1:
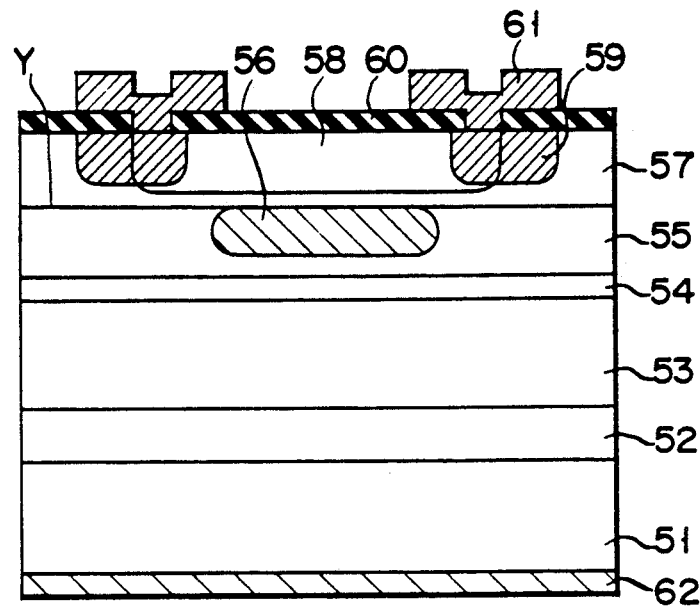
FIG. 1 is a sectional view showing the structure of a conventional APD.

FIG. 2 is a sectional view showing an APD of the first embodiment of the present invention, and FIGS. 3A through 3G shows the manufacturing process thereof, in order. In the manufacturing process, n⁻type InP buffer layer 12, n⁻type InGaAs light absorption layer 13, n-type InGaAsP buffer layer 14, and n⁻type InP window layer 15 are successively formed on n-type InP substrate 11 by crystal growth (i.e. the first crystal growing step). These layers are formed by use of the MOCVD process in such a manner that the layers are in lattice matching with substrate 11 (See FIG. 3A). The carrier concentrations of layers 12, 13, 14 and 15 are approximately $5 \times 10^{15}$ cm$^{-3}$, $2 \times 10^{15}$ cm$^{-3}$, $1 \times 10^{16}$ cm$^{-3}$, and $8 \times 10^{15}$ cm$^{-3}$ respectively, and the thicknesses of layers 12, 13, 14 and 15 are approximately 4 $\mu$m, 2 $\mu$m, 0.4 $\mu$m, and 2 $\mu$m, respectively.

Figure 3A:
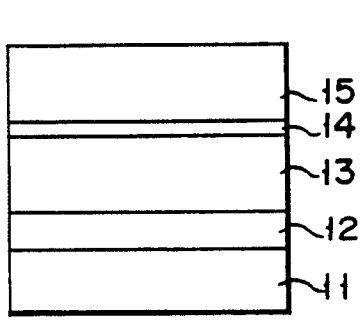
FIGS. 3A, 3B, 3C, 3D, 3E, 3F and 3G are sectional views showing the steps for manufacturing the APD shown in FIG. 2.
Figure 3B:
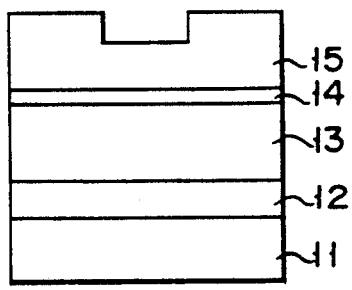
Figure 3C:
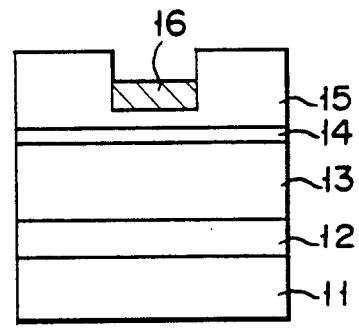
Figure 3D:
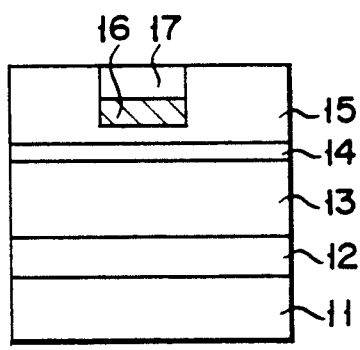

Next, after placing a mask on the surface of InP layer 15, a cylindrical depression having a diameter of 30 $\mu$m$\phi$ and a depth of 1 $\mu$m is formed by selective etching, as is shown in FIG. 3B. Si ions are doped into this depression, with an acceleration voltage of 200 kV applied and with a dose amount of $1 \times 10^{13}$ cm$^{-2}$ maintained, as is shown in FIG. 3C. After the mask is removed, the resultant structure is subjected to heat treatment at a temperature of 700° C. Thereafter, n⁻-type InP layer 17 is formed by crystal growth (i.e. the second crystal growing step) by use of the MOCVD process such that the depression is filled with InP layer 17, as is shown in FIG. 3D. As a result of the heat treatment, the region doped with the Si becomes n-type high concentration region 16.

Figure 3E:
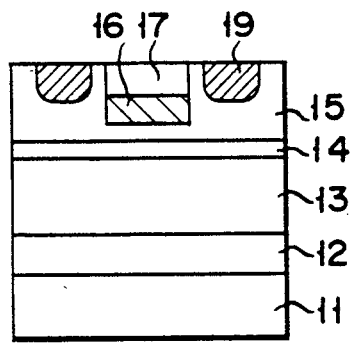
Figure 3F:
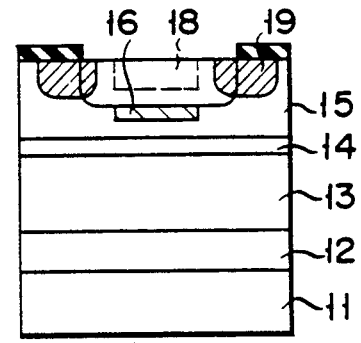

After high concentration region 16 is formed in this fashion, an annular mask having an inner diameter of 40 $\mu$m$\phi$ and an outer diameter of 60 $\mu$m$\phi$ is placed on the region formed by the first crystal growing step. In this condition, Be ions are doped into the structure, with an acceleration voltage of 150 kV applied and with a dose amount of $5 \times 10^{13}$ cm$^{-2}$ maintained. After mask is removed, the structure is subjected to a heat treatment at a temperature of 750° C., to thereby form guard ring 19, as is shown in FIG. 3E. The SiN film deposited on the surface of the structure is patterned out into a circular shape having a diameter of 50 $\mu$m$\phi$, and then Cd diffusion is performed at a temperature of 560° C., to thereby form p⁺-type region 18 of the light-receiving region, as is shown in FIG. 3F. At this time, the Cd is diffused in such a manner as to completely cover InP layer 17, so that the interface formed by the second crystal growing step is included in p+-type region 18. As a result, a pn junction serving as a light-receiving region is defined between n-type and p+-type high concentration regions 16 and 18.

Figure 3G:
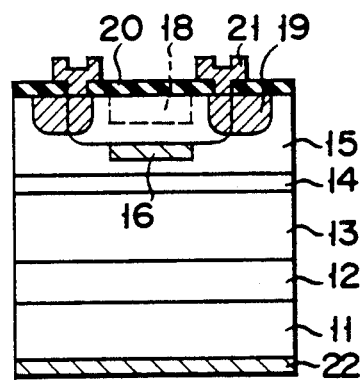

Finally, SiN film 20 serving as a reflection-preventing film is formed over the light-receiving region, and p-side electrode 21 formed by a Ti/Pt/Au film and n-side electrode 22 formed by an AuGe/Au film are respectively formed on the obverse and reverse surfaces of the entire structure, as is shown in FIG. 3G.

In the above-mentioned manufacturing process, the doping of Be ions used for forming a guard ring may be performed immediately after the first crystal growing step. In this case, the formation of the depression and the implantation of Si ions are performed after the doping of the Be ions, and then InP crystals are grown in such a manner as to fill the depression, with the ion-implanted region annealed simultaneously. If an APD is manufactured in this fashion, the number of heat treatments required can be reduced, and the manufacturing process is therefore simplified.

In the case of the conventional structure shown in FIG. 1, interface Y formed by the second crystal growing step is located in the n-side region of the p+n junction and is therefore supplied with a high electric field when the APD is operated. In contrast, in the case of the embodiment's structure shown in FIG. 2, interface X formed by the second crystal growing step is located in the p+-side region, so that it is not supplied with a high electric field when the APD is operated. Therefore, the performance of an APD produced by the above-mentioned manufacturing method is not influenced by the interface which is formed by the second crystal growing step and which may not have a satisfactory crystalline structure. Further, the APD produces little dark current and is very reliable in operation. It should be also noted that the above-mentioned manufacturing method produces APDs with a high manufacturing yield.

Figure 4:
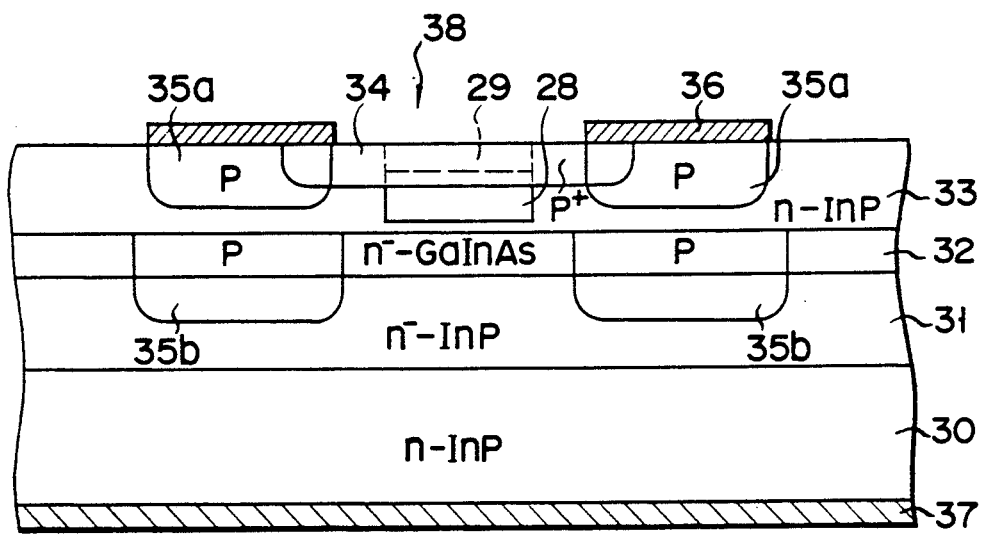
FIG. 4 is a sectional view showing the structure of an APD according to the second embodiment of the present invention.

FIG. 4 is a sectional view schematically showing the main portion of an InGaAs/InP-based APD according to the second embodiment of the present invention.

Referring to FIG. 4, n$^-$-type InP buffer layer 31, n$^-$-type InGaAs light absorption layer 32, and n-type InP layer 33 are formed on n-type InP substrate 30. The carrier concentrations of layers 31, 32 and 33 are approximately $2 \times 10^{15}$ cm$^{-3}$, $2 \times 10^{15}$ cm$^{-3}$ and $2 \times 10^{16}$ cm$^{-3}$, respectively. The thicknesses of layers 31, 32 and 33 are approximately 4 μm, 2 μm and 3 μm, respectively. In light-receiving region 38, ion-implanted high concentration n-type region 28 and crystal-grown n-type InP layer 29 (with which n-type region 28 is covered) are formed in a similar manner to that of the first embodiment shown in FIG. 2. P+-type InP region 34 is formed in such a manner that it is 2 μm deep from the surface of InP layer 33 and that it includes the interface between region 28 and layer 29. InP region 34 provides a sharp pn junction with high concentration n-type region 28. Around light-receiving region 38, p-type guard ring 35a which is 2.5 μm deep from the surface of InP layer 33 and p-type guard ring 35b which extends from light absorption layer 32 to buffer layer 31 are formed. To permit a reverse bias to be applied to the APD, p-side contact electrode 36 and n-side contact electrode 37 are respectively formed on the obverse and reverse of the structure.

In the APD of the second embodiment, the guard rings constitute a p-n-p-n thyristor construction, and a voltage applied to the APD is distributed between the two reverse bias junctions. Therefore, a sufficiently high withstand voltage can be obtained with respect to the guard rings.

FIGS. 5A to 5D are sectional views showing the steps for manufacturing the APD shown in FIG. 4.

Figure 5A:
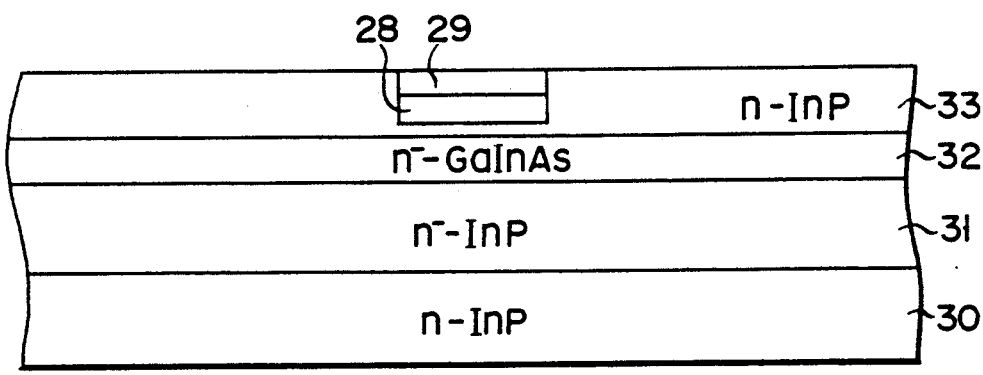
FIGS. 5A, 5B, 5C and 5D are sectional views showing the steps for manufacturing the APD shown in FIG. 4.
Figure 5B:
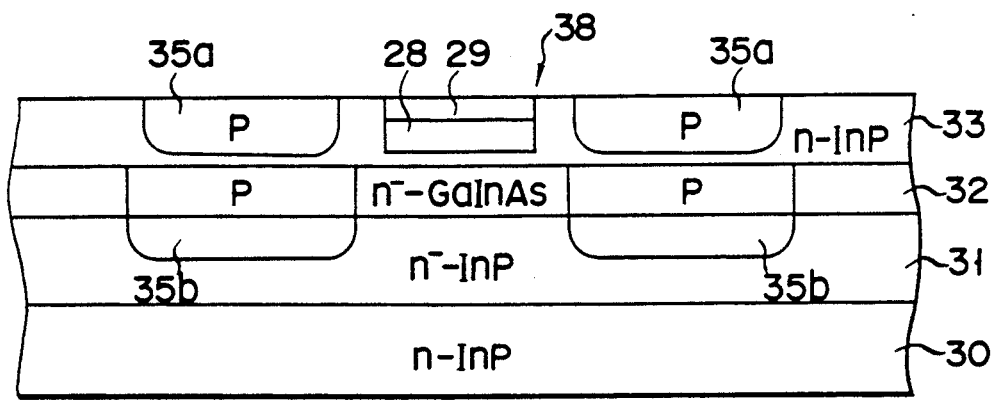

As is shown in FIG. 5A, n$^-$-type InP buffer layer 31, n$^-$-type InGaAs light absorption layer 32, and n-type InP window layer 33 are formed on n-type InP substrate 30 in the order mentioned. Further, ion-implanted high concentration n-type region 28 and crystal-grown n-type InP layer 29 (with which n-type region 28 is covered) are formed in light-receiving region 38, in a similar manner to that of the first embodiment shown in FIG. 2. Next, as is shown in FIG. 5B, an acceptor is doped by implanting Mg ions into regions around light-receiving region 38 and annealing the resultant structure, so as to form guard rings 35a and 35b. The acceptor is doped such that its concentration $C_{AG}$ is high in the surface regions and decreases toward the deep regions. In the meantime, the background donor concentration is high in uppermost window layer 33, and low in both light absorption layer 32 and buffer layer 31 (i.e., $C_{D3}$ [the donor concentration in the window layer] = $2 \times 10^{16}$ cm$^{-3}$; $C_{D2}$ [the donor concentration in the light absorption layer] = $C_{D1}$ [the donor concentration in the buffer layer] = $2 \times 10^{15}$ cm$^{-3}$). Therefore, the acceptor concentration can be controlled such that the relation $C_{AG} > C_{D3}$ is established in the surface region ($C_{AG} > 2 \times 10^{16}$ cm$^{-3}$ in the case of the second embodiment), the relation $C_{D3} > C_{AG} > C_{D2}$ is established at the interface between window layer 33 and light absorption layer 32 ($2 \times 10^{16}$ cm$^{-3}$ > $C_{AG}$ > $2 \times 10^{15}$ cm$^{-3}$ in the case of the second embodiment), the relation $C_{AG} > C_{D2} = C_{D1}$ is established at the interface between light absorption layer 32 and buffer layer 31 ($C_{AG} > 2 \times 10^{15}$ cm$^{-3}$ in the case of the second embodiment), and the relation $C_{AG} < C_{D1} = C_{D2}$ is established at the interface between buffer layer 31 and substrate 30. With the acceptor concentration controlled in the above way, guard ring 35a which is 2.5 μm deep from the surface of InP layer 33 and guard ring 35b which extends from light absorption layer 32 to buffer layer 31 are formed.

Figure 5C:
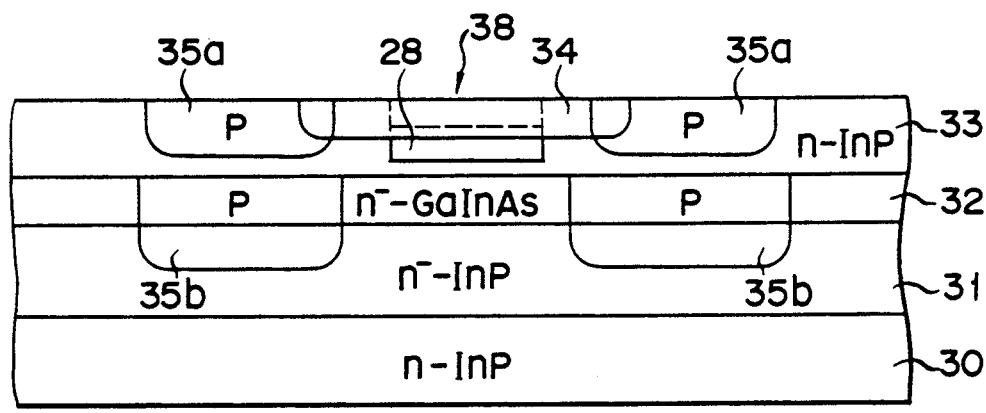

Next, as is shown in FIG. 5C, Cd is diffused in a selected portion of light-receiving region 38 such that p+-type InP region 34 having a depth of 2 μm is formed. At this time, the Cd is diffused in such a manner as to completely cover InP layer 29, so that the interface formed by the second crystal growing step is included in the p+-type region.

Figure 5D:
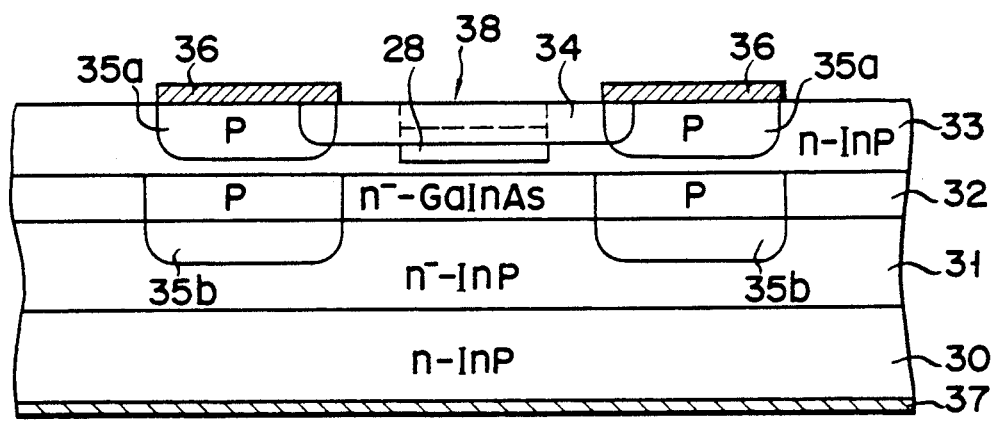

Finally, as is shown in FIG. 5D, Ti/Pt/Au electrode 36 serving as a p-side electrode and an AuGe/Au electrode 37 serving as an n-side electrode are formed.

In the APD of the second embodiment, the guard rings constitute a p-n-p-n thyristor construction, as mentioned above. In addition, the carrier concentration in each portion of the guard rings is as low as about $10^{16}$ cm$^{-3}$ as a result of the compensation effect acting between the acceptor and the donor. Therefore, a high guard ring effect is obtained in the case of the second embodiment.

The present invention has been described in detail, referring to the preferred embodiments shown in the accompanying drawings. It is apparent, however, that the present invention can be modified or improved in various manners without departing from the spirit thereof.

What is claimed is:

1. A semiconductor photodetector device, comprising:
    a light absorption layer of a first-conductivity type;
    a window layer formed on the light absorption layer and of the first-conductivity type;
    a high concentration region which is of the first-conductivity type and is located in the bottom of a depression formed in a selected surface portion of the window layer;
    a re-grown region which is of the first-conductivity type and is formed over the first-conductivity type high concentration region in such a way as to fill the depression;
    a first guard ring which is formed around the depression and of a second-conductivity type; and
    a high concentration region which is of the second-conductivity type and is formed in the window region in a manner which surrounds the re-grown region, said first and second-conductivity type high concentration regions jointly defining a junction used as a light-receiving region.

2. A semiconductor photodetector device according to claim 1, wherein said first and second-conductivity types are n and p types, respectively, said light absorption layer is formed of one of InGaAs and InGaAsP, and said window layer and said re-grown region are formed of InP.

3. A semiconductor photodetector device according to claim 1, wherein a second guard ring of the second-conductivity type is further provided below the first guard ring, and a low concentration region of the first-conductivity type exists between the first and second guard rings.

4. A semiconductor photodetector device according to claim 1, wherein said first-conductivity type high concentration region, said first guard ring, and said second-conductivity type high concentration region are formed by the doping of predetermined impurities.

5. A method of manufacturing a semiconductor photodetector device, comprising the steps of:
    growing a first-conductivity type light absorption layer and a first-conductivity type window layer on a first-conductivity type substrate crystal;
    forming a depression in a selected surface portion of the window layer;
    forming a first-conductivity type high concentration region in the bottom of the depression by doping first-conductivity type impurities into the bottom of the depression;
    forming a first-conductivity type re-grown region by growing a first-conductivity type crystalline layer on the first-conductivity type high concentration layer in such a way as to fill the depression;
    forming a second-conductivity type first guard ring around the depression by doping second-conductivity type impurities into a region located around the depression; and
    forming a second-conductivity type high concentration region by doping second-conductivity type impurities into the window layer in such a way as to surround the first-conductivity type re-grown region, whereby a junction used as a light-receiving region is defined between the first and second-conductivity type high concentration regions.

6. A method according to claim 5, wherein said first and second-conductivity types are n and p types, respectively, said substrate crystal is formed of InP, said light absorption layer is formed of one of InGaAs and InGaAsP, and said window layer and said re-grown region are formed of InP.

7. A method according to claim 5, wherein said first-conductivity type high concentration region and said first guard ring are formed by impurity ion-implantation process, and said second-conductivity type high concentration region is formed by use of an impurity thermal diffusion process.

8. A method according to claim 7, wherein ion-implantation for forming the first guard ring is performed prior to the formation of the depression.

9. A method according to claim 5, wherein said step of forming the guard ring includes a substep for forming a second-conductivity type second guard ring located below the first guard ring such that a low-impurity concentration layer of the first-conductivity type is interposed between the first and second guard rings.

10. A method according to claim 9, wherein:
    said first and second guard rings are formed simultaneously, by setting the first-conductivity type impurity concentration in the window layer to be higher than that in the light absorption layer beforehand and by controlling the doping concentration of the second-conductivity type impurities to decrease from the surface of the window layer toward internal regions; and
    the relation $C_{AG}>C_{DX}$ is established in the surface regions of the window layer, the relation $C_{GA}<C_{DX}$ is established in regions just above the light absorption layer, the relation $C_{AG}>C_{DX}$ is established in the uppermost portion of the light absorption layer, and the relation $C_{AG}<C_{DX}$ is established in regions just above the substrate crystal, where $C_{DX}$ denotes the first-conductivity type impurity concentration in regions located between the substrate crystal and the surface of the window layer, and $C_{AG}$ denotes the doping concentration of the second-conductivity type impurities.

* * * * *